United States Patent [19]
Dortu

[11] Patent Number: 6,043,694
[45] Date of Patent: Mar. 28, 2000

[54] LOCK ARRANGEMENT FOR A CALIBRATED DLL IN DDR SDRAM APPLICATIONS

[75] Inventor: Jean-Marc Dortu, South Burlington, Vt.

[73] Assignee: Siemens Aktiengesellschaft, Munich, Germany

[21] Appl. No.: 09/103,871

[22] Filed: Jun. 24, 1998

[51] Int. Cl.[7] .................................................. H04L 7/02
[52] U.S. Cl. ........................................... 327/156; 327/159
[58] Field of Search ..................................... 327/147, 149, 327/156, 158, 159, 161; 375/362, 373, 375, 376

[56] References Cited

U.S. PATENT DOCUMENTS

| | | | |
|---|---|---|---|
| 4,386,323 | 5/1983 | Jansen | 327/152 |
| 4,453,259 | 6/1984 | Miller | 375/106 |
| 4,795,985 | 1/1989 | Gailbreath, Jr. | 327/158 |
| 5,105,108 | 4/1992 | Ngo | 327/158 |
| 5,164,677 | 11/1992 | Hawkins et al. | 327/158 |
| 5,192,886 | 3/1993 | Wetlaufer | 327/158 |
| 5,355,037 | 10/1994 | Andersen et al. | 327/158 |
| 5,457,718 | 10/1995 | Anderson et al. | 375/373 |
| 5,463,337 | 10/1995 | Leonowich | 327/158 |
| 5,463,655 | 10/1995 | Llewellyn | 375/359 |
| 5,646,564 | 7/1997 | Erickson et al. | 327/158 |
| 5,663,665 | 9/1997 | Wang et al. | 327/3 |
| 5,771,264 | 6/1998 | Lane | 375/376 |

*Primary Examiner*—Tuan T. Lam
*Attorney, Agent, or Firm*—Stanton C. Braden

[57] ABSTRACT

A calibrated Delay Locked Loop (DLL) arrangement synchronizes an output data signal thereof to an input clock signal. A delay line receives the input clock signal and generates a clock output signal having a selective delay. A gating circuit receives the clock output signal and separately generates an imitation data signal that corresponds to the clock output signal, and latches an input data signal with the output clock signal to generate an output data signal. The gating circuit is also responsive to a switching control signal having a first logical value for providing only the output data signal to an output thereof, and to the switching control signal having a second logical value for providing only the imitation data signal to an output thereof. A driver receives the gating circuit output signal and provides this signal as the calibrated DLL arrangement output data signal. A phase comparator in a feedback loop from the output of the driver is responsive to the switching control signal having the second logical value for comparing the input clock signal and the imitation data signal appearing at the driver output, and for causing the delay line to selectively synchronize the imitation data signal to the input clock signal. A switching control signal having the first logical value idles the phase comparator and maintains a latest delay introduced by the delay line.

17 Claims, 3 Drawing Sheets

LOCK ARRANGEMENT FOR A CALIBRATED DLL IN DDR SDRAM APPLICATIONS

FIELD OF THE INVENTION

The present invention relates to a locking scheme for a calibrated Delay Locked Loop (DLL) arrangement for use in Double Data Rate (DDR) Synchronous Dynamic Random Access Memory (SDRAM) applications.

BACKGROUND OF THE INVENTION

A Delay Locked Loop (DLL) operates to compare a periodic input signal, such as a clock input, with a clock output signal, and sets a delay line between the input and output signals in a way that the phase differences between these two signals becomes zero.

U.S. Pat. No. 4,795,985 (Gailbreath, Jr.), issued on Jan. 3, 1989, discloses a digital phase locked loop comprising a crystal oscillator, a programmable delay line, a phase detector, and a loop control state machine. The crystal oscillator generates a reference clock signal at a predetermined frequency and provides it as an input to the programmable delay line. The delay line provides up to X nanoseconds of delay corresponding to one complete period of the reference clock in discrete steps of Y nanoseconds. The output of the delay line is compared to digitized data transitions in the phase detector, and if the reference clock leads or lags the data transitions, the state machine provides control signals to program the delay line in a direction that minimizes the phase error between the data transitions and the reference clock signal output by the delay line.

Referring now to FIG. 1, there is shown two possible versions of an exemplary prior art Delay Locked Loop (DLL) arrangement 10 (shown within a dashed line rectangle) for synchronizing an input clock signal to an output clock signal. A first version of the DLL arrangement 10 comprises a first receiver 20, a programmable delay line 22, a driver 24, a first optional feedback path 25 (shown by a dashed line) with a delay element 26 (shown as a dashed line block) providing a delay of [R+D] coupled therein, and a phase comparator 28. The first receiver 20 receives the input clock signal and generates a corresponding clock output signal with an inherent delay of [R] introduced by the internal circuitry of the first receiver 20. The output signal from the first receiver 20 is provided as an input to the delay line 22 and to a first input of the phase comparator 28. The delay line 22 is programmable and introduces a selective delay into the clock signal from the first receiver 20 dependent on a control signal from the phase comparator 28. The delay line 22 provides a clock output signal with a delay of [T−D], where T is the period, or a multiple of the period, of the output clock signal from the DLL arrangement 10, and D is the anticipated delay to be introduced by the circuitry of the driver 24. The Driver 24 receives the output signal from the delay line 22 and, after introducing its inherent internal delay [D], provides a clock output signal from the DLL arrangement 10 which has a delay of [T] which corresponds to a multiple of the period of the output clock when correct compensation is provided by the DLL arrangement 10. When the output clock signal has the delay [T], then it is in phase with the input clock signal. The first optional feedback path 25 couples the output from the delay line 22 to an input of the delay element 26 which provides a delay of R+D to generate an output signal with a delay of T+R that is provided to a second input of the phase comparator 28. The phase comparator 28 compares the phase of the output signals from the first receiver 20 and the delay element 26, and generates an output control signal corresponding to the results of the comparison to the delay line 22. The control signal from the phase comparator 28 causes the delay line 22 to selectively make adjustments to the delay therein as indicated by the control signal. A disadvantage of the first version of the arrangement 10 is that the loading of the driver 24 and its associated delay cannot be taken into account for different loading conditions. For example, the number of Dual Inline memory Modules (DIMMs) on a board can vary considerably to provide different loading conditions on the driver 24.

Theoretically, this disadvantage can be overcome by a second version of the DLL arrangement 10. In this second version, the first receiver 20, the programmable delay line 22, the driver 24, and the phase comparator 28 of the first version remain, but a second optional feedback path 30 (shown by a dashed line) replaces the feedback path 25 of the first version of the DLL arrangement 10. The second optional feedback path 30 feeds back the clock signal present at the output of the driver 24 via a second receiver 32 (shown by a dashed line block) to the second input of the phase comparator 28. The second receiver 32 effectively has the same internal delay [R] as the first receiver 20.

Referring now to FIG. 2, there is shown typical voltage waveforms for a clock signal 35 and a DDR data (DQ) signal 36 versus time. A DLL arrangement 10 produces a negative delay clock output according to the principle described above to get the result shown by the clock signal 35. The DQ signal 36 is represented in FIG. 2 by both positive and negative DDR pulses during each high and low clock pulse because it is not known whether the DDR data is high or low during each high and low clock pulse. Therefore, for a Double Data Rate (DDR) transmission, one bit of DDR data is generated during the high clock pulse and one bit of DDR data is generated during the low clock pulse of the clock period 37. Since DQ data (not shown in FIG. 1) arrives at an output of the DDL 10 in a random way, the output signal of the second version of the DDL arrangement 10 (with the second optional feedback path 30) cannot be used. Instead, an arrangement according to the principles of the first version of the DDL arrangement 10 (with the first optional feedback path 25) has to be used. The drawback of such method is that the loading of the Driver 24 is not taken into account. Since the number of Dual Inline Memory Modules (DIMMS) on a board can vary considerably, the resulting load variations on a data (DQ) line can be very important since the prospective DDR timing allows for a CLOCK/DQ skew of only ±1 nanosecond at 100 Megahertz. There are many contributors that produce this skew, and the offset introduced by the load variations makes the functionality of the DDR scheme with DLL questionable.

It is desirable to provide an arrangement which permits DDR data to be outputted in synchronization with a predetermined clock signal in DDR SDRAM applications without concern about output loading.

SUMMARY OF THE INVENTION

The present invention is directed to a locking scheme for a calibrated Delay Locked Loop (DLL) arrangement for use in, for example, Double Data Rate (DDR) Synchronous Dynamic Random Access Memory (SDRAM) applications.

Viewed from one aspect, the present invention is directed to a calibrated Delay Locked Loop (DLL) comprising a DLL locking arrangement, and a gating circuit. The DLL locking arrangement comprises a selectively adjustable delay line which is responsive to a received input clock signal for generating an output clock signal that is in phase with the input clock signal, and a driver for providing an output data signal from the calibrated Delay Locked Loop. The gating circuit is coupled between the selectively adjustable delay line and the driver. The gating circuit is responsive to the received output clock signal from the selectively adjustable delay line for separately (a) generating an imitation data signal which is in phase with said received output clock signal, and (b) latching a received input data signal to generate a data output signal that is in phase with said received output clock signal. The gating circuit is further responsive to a switching control signal having a first logical value for coupling only the generated data output signal to an input of the driver, and to the switching control signal having a second logical value for only coupling the generated imitation data signal to the input of the driver. The DLL locking arrangement is responsive to the switching control signal having the second logical value for synchronizing the generated imitation data signal appearing at the driver output to the clock input signal to generate the output clock signal from the delay line. The DLL locking arrangement is further responsive to the switching control signal having the first logical value to disable any synchronization of the generated data output signal at the driver output to the clock input signal and to maintain a latest output clock signal produced during the period when the switching control signal having the second logical value was applied.

Viewed from another aspect, the present invention is directed to a calibrated Delay Locked Loop (DLL) arrangement comprising a delay line, a driver, a gating circuit, and a phase comparator. The delay line responsive to a clock input signal for generating an output clock signal having a selective delay. The gating circuit is coupled between the selectively adjustable delay line and the driver. The gating circuit is responsive to the received output clock signal from the selectively adjustable delay line for separately (a) generating an imitation data signal which is in phase with said received output clock signal, and (b) latching a received input data signal to generate a data output signal that is in phase with said received output clock signal. The gating circuit is further responsive to a switching control signal having a first logical value for coupling only the generated data output signal to an output thereof. The gating circuit is also responsive to the switching control signal having a second logical value for only coupling the generated imitation data signal to the output thereof. The driver is responsive the output signal from the gating circuit for generating an output of the calibrated DLL arrangement. The phase comparator is responsive to the switching control signal having the second logical value for comparing the clock input signal with the generated imitation data signal appearing at the driver output and for generating a control signal representative of the comparison to the delay line for causing the output clock signal therefrom to be selectively placed in phase with the input clock signal. The phase comparator is also responsive to the switching control signal having the first logical value to disable any comparison of the clock input signal with the generated data output signal at the driver output and maintain a latest delay introduced by the delay line during the period when the switching control signal having the second logical value was applied to the phase comparator.

Viewed from still another aspect, the present invention is directed to a calibrated Delay Locked Loop arrangement comprising a receiver, a delay line, a gating circuit, a driver, and a feedback loop. The receiver receives a clock input signal and generates a clock output signal corresponding to the clock input signal. The delay line is responsive to the clock output signal from the receiver for generating an output clock signal having a selective delay therein. The gating circuit is coupled between the selectively adjustable delay line and the driver. The gating circuit is responsive to the received output clock signal from the selectively adjustable delay line for separately (a) generating an imitation data signal which is in phase with said received output clock signal, and (b) latching a received input data signal to generate a data output signal that is in phase with said received output clock signal. The gating circuit is further responsive to a switching control signal having a first logical value for coupling only the generated data output signal to an output thereof. The gating circuit is also responsive to the switching control signal having a second logical value for only coupling the generated imitation data signal to the output thereof. The driver provides the output signal from the gating circuit as an output of the driver to form to output signal from the calibrated Delay Locked Loop arrangement. The feedback loop is coupled to the output of the driver and comprises a phase comparator which is responsive to the switching control signal having the second logical value for comparing the clock input signal with the driver output signal and generating a control signal to the delay line for selectively introducing a corresponding delay into the output clock signal from the delay line. The phase comparator is also responsive to the switching control signal having the first logical value to prevent the comparison of the clock input signal with the driver output signal and maintain a latest delay introduced by the delay line.

The invention will be better understood from the following more detailed description taken with the accompanying drawings and claims.

DETAILED DESCRIPTION

Figure 3:
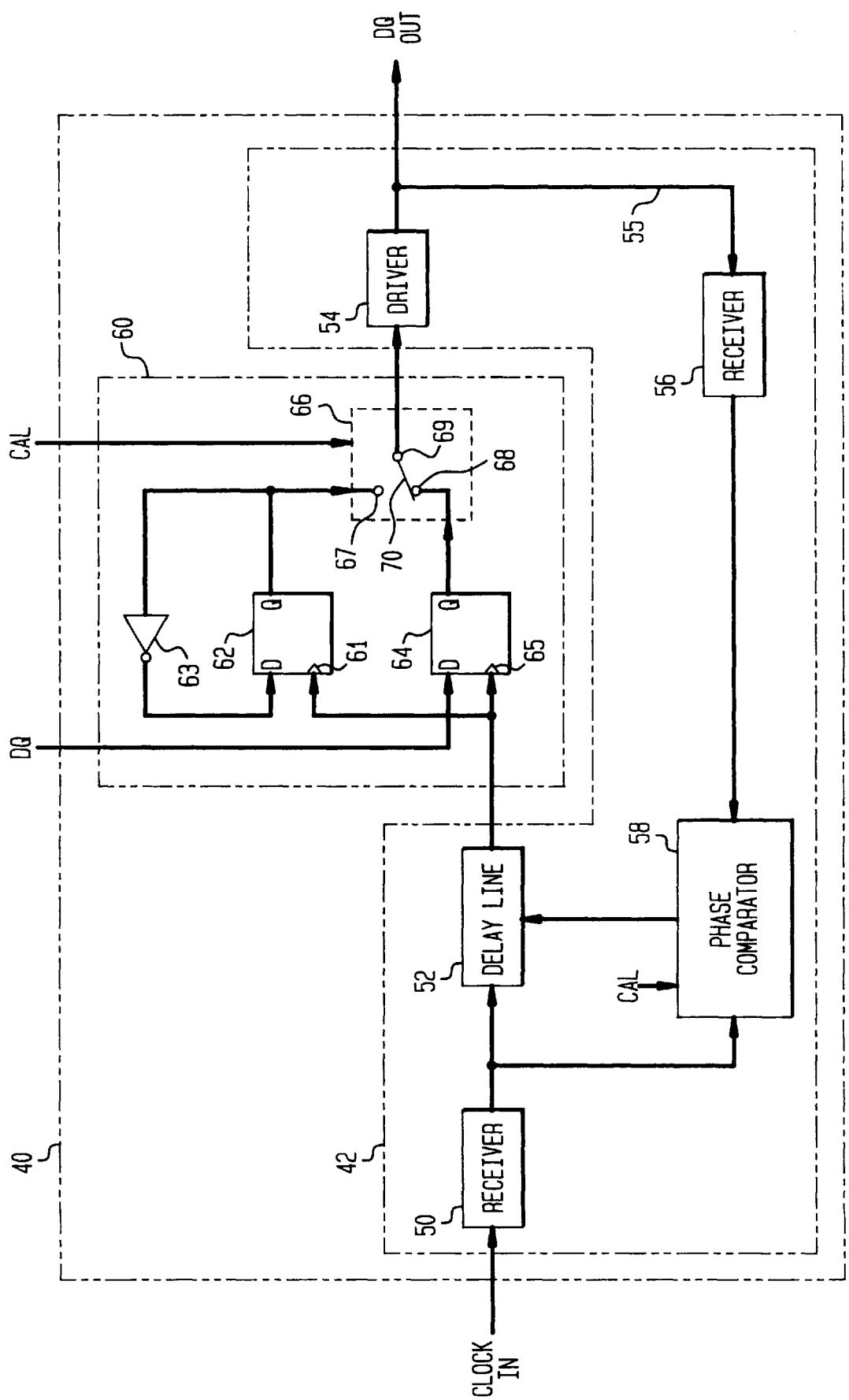
FIG. 3 is a block diagram of a calibrated Delay Locked Loop (DLL) arrangement in accordance with the present invention.

Referring now to FIG. 3, there is shown a block diagram of a calibrated Delay Locked Loop (DLL) arrangement 40 (shown within a dashed line rectangle) in accordance with the present invention. The calibrated DLL arrangement 40 can also be called a calibrated DLL 40. The calibrated DLL arrangement 40 comprises a DLL locking arrangement 42 (shown within a dashed line area) and a gating circuit 60 (shown within a dashed line rectangle). The DLL locking arrangement 42 comprises a first receiver 50, a delay line 52, a driver 54, and a feedback path 55 comprising a second receiver 56, and a phase comparator 58 serially coupled back to the delay line 52. The gating circuit 60 comprises a first flip-flop 62, an inverter 63, a second flip-flop 64, and a switching device 66.

In the DLL locking arrangement 42, the first receiver 50 receives a clock input signal at a predetermined frequency, and generates therefrom a clock output signal that includes a very slight inherent delay caused by the internal circuitry of the first receiver 50. For Double Data Rate (DDR) Synchronous Dynamic Random Access Memory (SDRAM)

applications, the input clock signal can have a frequency of, for example, 100 Megahertz. The clock output signal from the first receiver 50 is coupled to both a first input of the delay line 52 and to a first input of the phase comparator 58.

The delay line 52 is responsive to the clock output signal from the first receiver 50 and to a control signal from the phase comparator 58 received at a second input of the delay line 52. The delay line 52 generates an output clock signal with a selective predetermined delay therein so that the clock input signal to the delay line 52 and the clock output signal from the delay line 52 are in phase. The output clock signal from the delay line 52 is coupled to the gating circuit 60 as will be described in greater detail hereinafter. The gating circuit 60 also receives a data signal (DQ), and a Calibrate (CAL) control signal which functions as a switching control signal for the gating circuit 60. The CAL control signal functions as a switching control signal for the gating circuit 60, is also used for setting predetermined conditions on a chip, and is supplied from a controller (not shown) that is used to control, for example, a synchronous memory on a Synchronous Dynamic Random Access Memory (SDRAM). The gating circuit 60 generates an output signal that is coupled to an input of the driver 54. The driver 54 generates an output signal that is both used as the DQ output (DQ OUT) signal from the calibrated DDL arrangement 40, and fed back via the feedback loop 55 to the second receiver 56. The second receiver 56 imparts an inherent delay into the fed back DQ output signal which is then provided as a second input to the phase comparator 58. The phase comparator 58 also receives the CAL control signal at a third input thereof, and compares the input clock signal from the first receiver 50 with the received DQ output signal from the second receiver 56 only when the CAL control signal comprises a first logical value (e.g., a logical 1).

When the CAL control signal comprises a second logical value (e.g., a logical 0), the phase comparator 58 is idled and does not perform comparisons of the two input signal, and the delay line 52 maintains the delay introduced just prior to the CAL control signal changing from the first logical value to the second logical value.

In the gating circuit 60, the output signal from the delay line 52 is coupled to control terminals 61 and 65 of the first and second flip-flops 62 and 64, respectively. The first and second flip-flops 62 and 64 are triggered by both edges of the clock input. A "Q" output terminal of the first flip-flop 62 is serially coupled through the inverter 63 to a "D" input of the first flip-flop 62. The "Q" output terminal of the first flip-flop 62 is also coupled to a first input terminal 67 of the switching device 66. The data signal (DQ) is coupled to a "D" input of the second flip-flop 64, and a "Q" output thereof is coupled to a second input terminal 68 of the switching device 66. An output terminal 69 of the switching device 66 is coupled to the input of the driver 54. The CAL control signal functions to move an armature 70 of the switching device 66 to couple either the first or second input terminals 67 or 68 to the output terminal 69.

Figure 1:
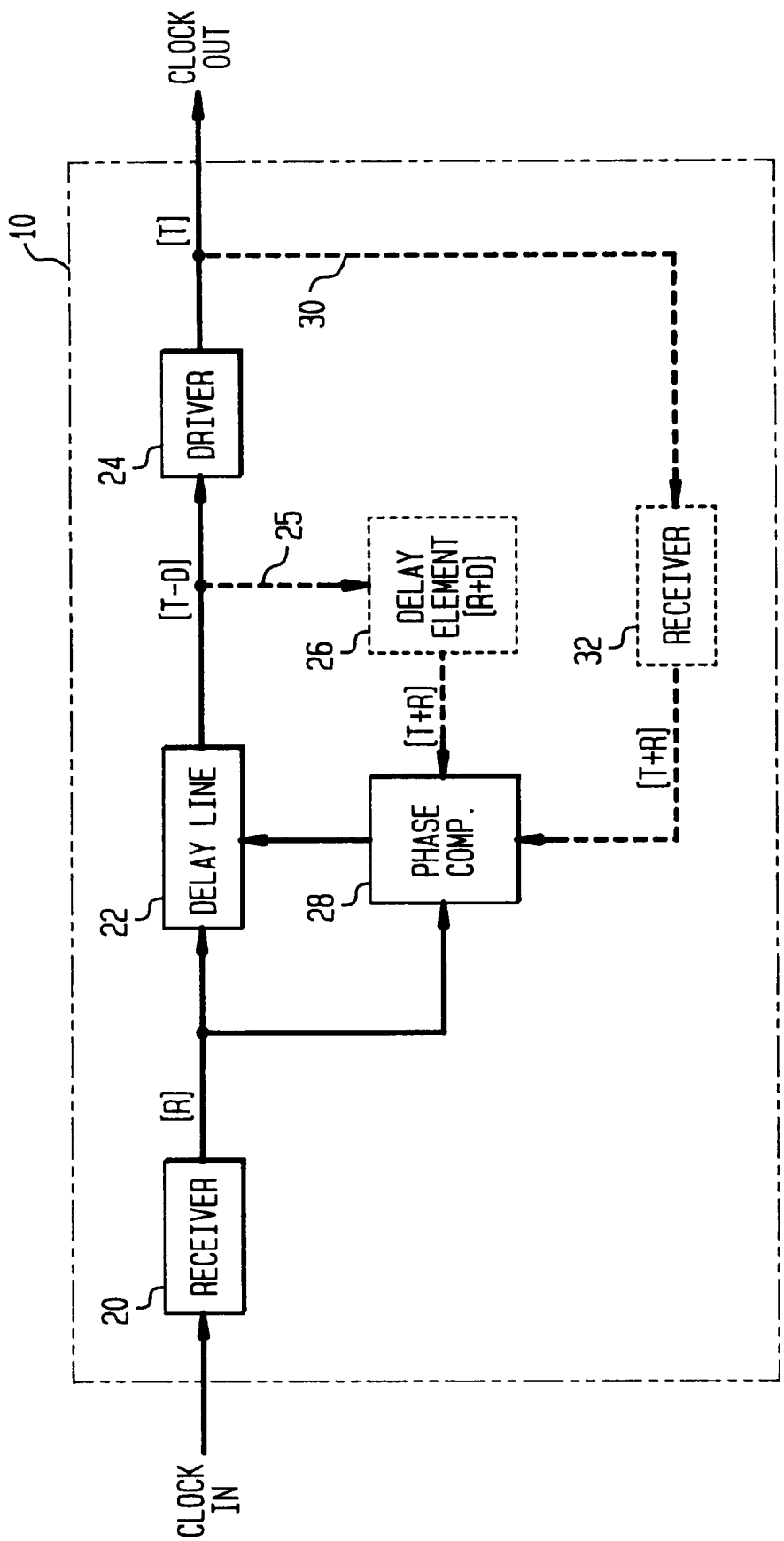
FIG. 1 is a block diagram showing a prior art Delay Locked Loop (DLL) arrangement with a first and second alternative feedback loop arrangement.
Figure 2:
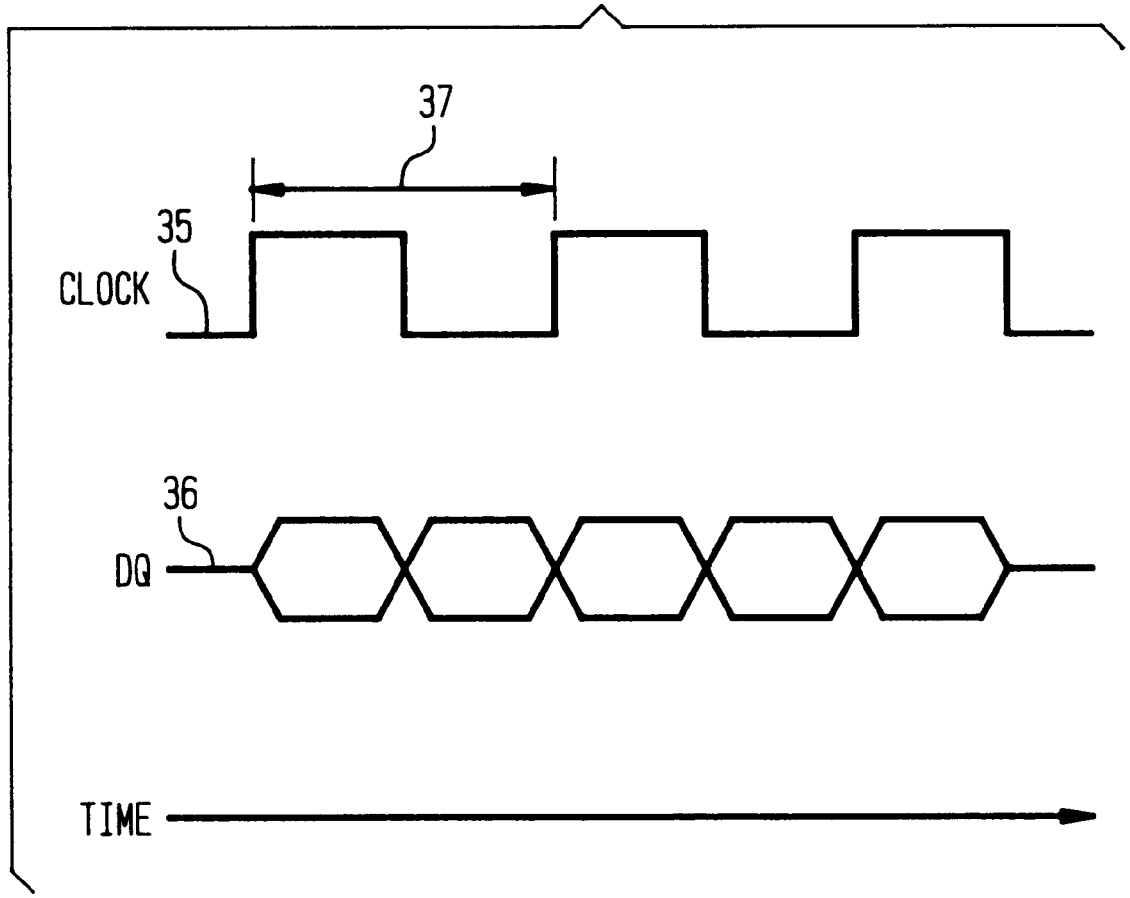
FIG. 2 shows typical voltage waveforms for a clock signal and a DDR data (DQ) signal versus time.

The gating circuit 60 operates in the following manner. The application of the clock signal from the delay line 52 to the control terminal of the first flip-flop 62 causes the first flip-flop 62 to generate a separate output clock signal corresponding to an imitation data signal of alternate "1's" and "0's" at the "Q" output thereof. More particularly, prior to initialization, the Q output of the first flip-flop provides a logical "0" to the inverter 63, which in turn provides a logical "1" to the "D" input of the first flip-flop 62. During a first half of a clock period 37 (shown in FIG. 2) when, for example, the leading edge of the input clock pulse goes positive, the first flip-flop 62 is placed in a steady first state, and the predetermined fixed voltage equal to a logical "1" that is currently provided at the "D" input of the first flip-flop 62 is outputted at the "Q" output to the first input 67 of the switching device 66 and to the inverter 63. The inverter 63 converts this logical "1" output signal from the first flip-flop 62 into a logical "0". During the second half of the clock period 37 when, for example, the trailing edge of the clock pulse goes to zero or a negative fixed voltage, the first flip-flop 62 is placed in a steady second state and outputs the predetermined fixed voltage equal to a logical "0" currently provided at the "D" input of the first flip-flop 62 to the first input 67 of the switching device 66 and to the inverter 63. This sequence is repeated for each subsequent clock cycle 37 shown in FIG. 2. Therefore, the first flip-flop 62 generates an output imitation data signal (e.g., 1-0-0-1-0 etc.) which has a periodicity corresponding to the output clock signal from the delay line 52. This output imitation data signal is coupled to the first input terminal 67 of the switching device 66.

In a similar manner, the second flip-flop 64 uses the output clock signal from the delay line 52 to gate the currently provided DQ signal values received at the "D" input of the second flip-flop 64 to its "Q" output with a periodicity corresponding to the output clock signal from the delay line 52. The DQ output signal from the second flip-flop 64 is coupled to the second input 68 of the switching device 66.

Under normal conditions, the CAL control signal applies, for example, a logical "0" to the switching device 66 and causes the armature 70 to couple the second input terminal 68 to the output terminal 69 so that the DQ signal at the second input terminal 68 of the switching device 66 is coupled to the output terminal 69 and to the input of the driver 54 (shown in FIG. 3). If the CAL control signal is changed to, for example, a logical "1", then the armature is moved to couple the first input terminal 67 to the output terminal 69 so that the generated imitation data output signal from the first flip-flop 62 is applied to the output terminal 69 and to the input of the driver 54.

In the calibrated DLL arrangement 40, it is desired that the DQ output signal from the driver 54 be in phase with the clock input signal to the calibrated DLL arrangement 40. This is accomplished by the output clock signal from the delay line 52 being used to generate an imitation data output signal from the first flip-flop 62 of the gating circuit 60, and a DQ output signal from the second flip-flop 64 of the gating circuit 66. Both of these output signals are in phase with the output signal from the delay line 52. The driver 54 receives either the DQ output signal (from the second flip-flop 64) or the generated imitation data output signal (from the first flip-flop 62) from the gating circuit 60 depending on the logical value of the CAL control signal to the switching device 66. Both of the DQ output signal and the imitation data output signal from the gating circuit 66 have a periodicity corresponding to the output clock signal from the delay line 52.

When the CAL control signal has a second logical value (e.g., a logical "0") it places the DLL arrangement 40 in the normal condition. In the normal condition, the DQ output signal (from the second flip-flop 64) from the gating circuit 60 is provided as the input to the driver 54. Concurrently, this same CAL control signal disables the functioning of the phase comparator 58 and effectively places the DLL arrangement 40 in an idle state. In the idle state, the value of the delay line 52 is maintained at the same value that the delay line 52 had just prior to the DLL arrangement 40 being placed in the idle state, and the DQ signal from the second flip-flop 64 of the gating circuit 60 is provided as the output of the DLL arrangement 40.

When the CAL control signal has a first logical value (e.g., a logical "1"), the calibrated DLL arrangement 40 works as a delay locked loop. More particularly, the generated imitation data output signal from the gating circuit 60 is provided as the input to the driver 54, and the driver 54 provides the imitation data signal to the output of the DLL arrangement 40. Concurrently the CAL control signal enables the functioning of the phase comparator 58. Under these conditions, the calibrated DLL arrangement 40 is active to synchronize the output imitation data signal that is fed back to the phase comparator 58 via feedback path 55 to the input clock signal of the calibrated DLL arrangement 40. Any difference in phase between the imitation data signal and input clock signal causes the phase comparator 58 to generate a control signal to the delay line 52 to selectively alter the phase of its output clock signal. Since the output clock signal from the delay line 52 is used by the first flip-flop 62 of the gating circuit 60 to generate the imitation data signal, any change of phase in the output clock signal from the delay line 52 will make a corresponding change in phase of the imitation data signal. Any resulting changes in the phase of the imitation data signal is again noted by the phase comparator 58 which keeps changing the phase of the output clock signal of the delay line 52 until the imitation data output signal is in phase with the input clock signal to the DLL arrangement 40. It is to be understood that the Data (DQ) signal cannot be used for comparison with the input clock signal to the DLL arrangement 40 during the calibration phase, because the DQ signal has an arbitrary logical sequence of "0's" and "1's" which will not match the fixed sequence of "0's" and "1's" of the input clock sequence. Therefore, the separate imitation data signal has to be generated by the gating circuit 60 in order to have a signal which appears as a clock signal (1-0-1-0-1-0) that can be used to compensate for any loads of the DLL arrangement 40.

From the above description, during the calibration condition, the calibrated DLL arrangement 40 ensures that the output clock signal from the delay line 52 has a predetermined delay to the gating circuit 60 for latching a data signal (DQ) to the output of the DLL arrangement 40 using the second flip-flop 64. By latching the DQ data signal to the output of the DLL arrangement 40 with the output clock signal from the delay line 52, a sample of the DQ signal provided at the output of the DLL arrangement 40 is in phase with a rising edge of the output clock signal from the delay line 52. In other words, the output data signal from the DLL arrangement 40 is not dependent on the arrival rate of the DQ signal, but is triggered by the input clock signal to the DLL arrangement 40 so that both the DQ output signal and the output clock signal from the delay line 52 are in phase.

The calibrated DLL arrangement 40 has a first advantage in that a power savings over standby power consumption of conventional DLLs is achieved because most of the circuitry within the DLL 42, such as the delay line 52 can be switched off in standby conditions once the calibration has been performed. A second, advantage is that a problem of tracking the receiver plus driver delays found in conventional DLLs is overcome with the present calibrated DLL arrangement 40.

It is to be appreciated and understood that the specific embodiments of the present invention described hereinabove are merely illustrative of the general principles of the invention. Various modifications may be made by those skilled in the art which are consistent with the principles set forth.

What is claimed is:

1. A calibrated Delay Locked Loop (DLL) comprising:
    a DLL locking arrangement comprising a selectively adjustable delay line which is responsive to a received clock input signal for generating an output clock signal that is in phase with the clock input signal, and a driver for providing an output data signal from the calibrated Delay Locked Loop; and
    a gating circuit coupled between the selectively adjustable delay line and the driver and being responsive to the output clock signal from the selectively adjustable delay line for separately (a) generating an imitation data signal which is in phase with said output clock signal from the selectively adjustable delay line, and (b) latching a received input data signal to generate a data output signal that is in phase with said output clock signal from the selectively adjustable delay line, the gating circuit being further responsive to a switching control signal having a first logical value for coupling only the data output signal generated within the gating circuit to an input of the driver, and to the switching control signal having a second logical value for only coupling the imitation data signal generated within the gating circuit to the input of the driver; and
    wherein the DLL locking arrangement is responsive to the switching control signal having the second logical value for synchronizing the imitation data signal appearing at the driver output to the clock input signal received by the DLL locking arrangement to generate the output clock signal from the adjustable delay line, and is responsive to the switching control signal having the first logical value to disable any synchronization of the output data signal at the driver output to the clock input signal and to maintain a latest output clock signal produced by the adjustable delay line during the period when the switching control signal having the second logical value was applied.

2. The calibrated DLL arrangement of claim 1 wherein the DLL locking arrangement further comprises:
    a phase comparator responsive to the switching control signal having the second logical value for comparing the clock input signal with the imitation data signal appearing at the driver output and generating a control signal representative of said comparison to the adjustable delay line for causing the output clock signal therefrom and, in turn, the imitation data signal to be selectively placed in phase with the clock input signal, and being responsive to the switching control signal having the first logical value signal to disable any comparison of the clock input signal with the output data signal at the driver output and to maintain a latest delay introduced by the adjustable delay line during the period when the second switching control signal having the second logical value was applied to the phase comparator.

3. The calibrated DLL arrangement of claim 2 wherein the gating circuit is responsive to the output clock signal from the adjustable delay line for generating the imitation data signal having alternating logical zeros and ones corresponding to a periodicity of said output clock signal.

4. The calibrated DLL arrangement of claim 3 wherein the gating circuit comprises:
    an imitation data signal generating arrangement that is responsive to the output clock signal generated by the adjustable delay line for generating the imitation data signal that is in phase with the output clock signal from the adjustable delay line;

a flip-flop that is responsive to the output clock signal generated by the adjustable delay line and the input data signal for generating the data output signal; and a switching device having a first input terminal for receiving the data output signal from the flip-flop, a second input terminal for receiving the imitation data signal from the imitation data signal generating arrangement, and an output terminal that is selectively coupled to the first and second input terminals in response to the switching control signal having the first and second logical values, respectively, and to the driver.

5. The calibrated DLL arrangement of claim 4 wherein the imitation data signal generating arrangement comprises:

a flip-flop comprising a control terminal coupled to receive the clock output signal from the adjustable delay line, an input terminal, and output terminal coupled to the second input terminal of the switching device; and an inverter coupled between the input and output terminals of the flip-flop.

6. The calibrated DLL arrangement of claim 1 wherein that gating circuit is responsive to the output clock signal for generating the imitation data signal having alternating logical zeros and ones corresponding to a periodicity of said output clock signal.

7. The calibrated DLL arrangement of claim 1 wherein the gating circuit comprises:

an imitation data signal generating arrangement that is responsive to the output clock signal generated by the adjustable delay line for generating the imitation data signal from the output clock signal from the adjustable delay line;

a flip-flop that is responsive to the output clock signal generated by the adjustable delay line and the input data signal for generating the data output signal; and a switching device having a first input terminal for receiving the data output signal from the flip-flop, a second input terminal for receiving the imitation data signal from the imitation data signal generating arrangement, and an output terminal that is selectively coupled to the first and second input terminals in response to the switching control signal having the first and second logical values, respectively, and to the driver.

8. The calibrated DLL arrangement of claim 7 wherein the imitation data signal generating arrangement comprises:

a flip-flop comprising a control terminal coupled to receive the output clock signal from the adjustable delay line, an input terminal, and output terminal coupled to the second input terminal of the switching device; and an inverter coupled between the input and output terminals of the flip-flop.

9. The calibrated DLL arrangement of claim 1 wherein the DLL is formed on a chip which is mounted on a Double Data Rate (DDR) Synchronous Dynamic Random Access Memory (SDRAM) board and obtains the input clock signal, the input data signal, and the switching control signal from the DDR SDRAM board.

10. A calibrated Delay Locked Loop (DLL) arrangement comprising:

a selectively adjustable delay line responsive to a clock input signal for generating an output clock signal having a selectively adjustable delay;

a gating circuit coupled between the selectively adjustable delay line and a driver and being responsive to the output clock signal from the selectively adjustable delay line for separately (a) generating an imitation data signal which is in phase with said output clock signal, and (b) latching a received input data signal to generate a data output signal that is in phase with said output clock signal from the selectively adjustable delay line, the gating circuit being further responsive to a switching control signal having a first logical value for coupling only the data output signal to an input of the driver, and to the switching control signal having a second logical value for only coupling the imitation data signal to the input of the driver;

the driver is responsive to the gating circuit for generating an output of the calibrated DLL arrangement; and a phase comparator responsive to the switching control signal having the second logical value for comparing the clock input signal with the imitation data signal appearing at the driver output and generating a control signal representative of the comparison to the adjustable delay line for causing the output clock signal therefrom to be selectively placed in phase with the input clock signal, and responsive to the switching control signal having the first logical value to disable any comparison of the clock input signal with the data output signal at the driver output and maintain a latest adjustable delay introduced by the delay line during the period when the switching control signal having the second logical value was applied to the phase comparator.

11. The calibrated Delay Locked Loop arrangement of claim 10 wherein the gating circuit comprises:

an imitation data signal generating arrangement that is responsive to the output clock signal generated by the delay line for generating the imitation data signal from the output clock signal from the delay line;

a flip-flop that is responsive to the output clock signal generated by the delay line and the input data signal for generating the data output signal; and a switching device having a first input terminal for receiving the data output signal from the flip-flop, a second input terminal for receiving the imitation data signal from the imitation data signal generating arrangement, and an output terminal that is selectively coupled to the first and second input terminals in response to the switching control signal having the first and second logical values, respectively, and to the driver.

12. The calibrated DLL arrangement of claim 11 wherein the imitation data signal generating arrangement comprises:

a flip-flop comprising a control terminal coupled to receive the output clock signal from the adjustable delay line, an input terminal, and output terminal coupled to the second input terminal of the switching device; and an inverter coupled between the input and output terminals of the flip-flop.

13. The calibrated Delay Locked Loop arrangement of claim 10 wherein the calibrated Delay Locked Loop arrangement is formed on a chip which is mounted on a Double Data Rate (DDR) Synchronous Dynamic Random Access Memory (SDRAM) board and obtains the input clock signal, the input data signal, and the switching control signal from the DDR SDRAM board.

14. A calibrated Delay Locked Loop arrangement comprising:

a receiver for receiving a clock input signal and for generating a clock output signal corresponding to the clock input signal;

a selectively adjustable delay line responsive to the clock output signal from the receiver for generating an output clock signal having a selectively adjustable delay therein;

a gating circuit coupled between the selectively adjustable delay line and a driver and being responsive to the output clock signal from the selectively adjustable delay line for separately (a) generating an imitation data signal which is in phase with said output clock signal, and (b) latching a received input data signal to generate a data output signal that is in phase with said output clock signal from the selectively adjustable delay line, the gating circuit being further responsive to a switching control signal having a first logical value for coupling only the data output signal to an output thereof, and to the switching control signal having a second logical value for only coupling the imitation data signal to the output thereof;

the driver providing an output signal for the calibrated Delay Locked Loop arrangement; and a feedback loop coupled to an output of the driver comprising a phase comparator which is responsive to the switching control signal having the second logical value for comparing the clock input signal with the driver output signal and generating a control signal to the adjustable delay line for selectively introducing a corresponding delay into the output clock signal from the adjustable delay line, and being responsive to the switching control signal having the first logical value to prevent the comparison of the clock input signal with the driver output signal and maintain a latest adjustable delay introduced by the delay line.

15. The calibrated Delay Locked Loop arrangement of claim 14 wherein the gating circuit comprises:

an imitation data signal generating arrangement that is responsive to the output clock signal generated by the adjustable delay line for generating the imitation data signal from the output clock signal from the adjustable delay line;

a flip-flop that is responsive to the output clock signal generated by the adjustable delay line and the input data signal for generating the data output signal; and a switching device having a first input terminal for receiving the data output signal from the flip-flop, a second input terminal for receiving the imitation data signal from the imitation data signal generating arrangement, and an output terminal that is selectively coupled to the first and second input terminals in response to the switching control signal having the first and second logical values, respectively, and to the driver.

16. The calibrated DLL arrangement of claim 15 wherein the imitation data signal generating arrangement comprises:

a flip-flop comprising a control terminal coupled to receive the output clock signal from the adjustable delay line, an input terminal, and output terminal coupled to the second input terminal of the switching device; and an inverter coupled between the input and output terminals of the flip-flop.

17. The calibrated Delay Locked Loop arrangement of claim 14 wherein the calibrated Delay Locked Loop arrangement is formed on a chip which is mounted on a Double Data Rate (DDR) Synchronous Dynamic Random Access Memory (SDRAM) board and obtains the clock input signal, the input data signal, and the switching control signal from the DDR SDRAM board.

* * * * *